(12) United States Patent
Yeh et al.

(10) Patent No.: US 6,501,187 B1
(45) Date of Patent: Dec. 31, 2002

(54) SEMICONDUCTOR PACKAGE STRUCTURE HAVING CENTRAL LEADS AND METHOD FOR PACKAGING THE SAME

(76) Inventors: Nai Hua Yeh, No. 84, Taiho Road, Chupei, Hsinchu Hsien (TW); Chen Pin Peng, No. 84, Taiho Road, Chupei, Hsinchu Hsien (TW); Chief Lin, No. 84, Taiho Road, Chupei, Hsinchu Hsien (TW); Ching-Shui Cheng, No. 84, Taiho Road, Chupei, Hsinchu Hsien (TW); Allis Chen, No. 84, Taiho Road, Chupei, Hsinchu Hsien (TW)

( * ) Notice: Subject to any disclaimer, the term of this patent is extended or adjusted under 35 U.S.C. 154(b) by 0 days.

(21) Appl. No.: 09/996,691

(22) Filed: Nov. 21, 2001

(51) Int. Cl.⁷ .................. H01L 23/28; H01L 23/52; H01L 29/40
(52) U.S. Cl. .................. 257/787; 257/784; 438/127
(58) Field of Search .................. 257/666, 676, 257/787, 784; 438/124, 126, 127, 367, 361

(56) References Cited

U.S. PATENT DOCUMENTS

| | | | | |
|---|---|---|---|---|
| 5,068,712 A | * | 11/1991 | Murakami | |
| 5,739,585 A | * | 4/1998 | Akram et al. | |
| 6,150,730 A | * | 11/2000 | Chung et al. | |
| 6,175,159 B1 | * | 1/2001 | Sasaki et al. | |
| 6,255,720 B1 | * | 7/2001 | Courtenay | |
| 6,307,755 B1 | * | 10/2001 | Williams et al. | |
| 6,337,511 B1 | * | 1/2002 | Grigg et al. | |

* cited by examiner

Primary Examiner—Sheila V. Clark
(74) Attorney, Agent, or Firm—Pro Techtor International Services

(57) ABSTRACT

A semiconductor package structure having central leads according to the invention includes a substrate, a semiconductor device, a plurality of wires, and glue. A long slot penetrating through the substrate is formed in the substrate. A plurality of bonding pads formed on the semiconductor device are mounted on substrate. The plurality of bonding pads on the semiconductor device are exposed via the long slot of the substrate. The length of the semiconductor device is smaller than that of the long slot of the substrate so that a channel is formed at one side of the long slot when the semiconductor device is mounted on the substrate. The plurality of wires are arranged within the long slot of the substrate for electrically connecting the plurality of bonding pads on the semiconductor device to the plurality of signal output terminals on the substrate. The glue is provided for sealing the upper surface of the substrate to protect the semiconductor device. The glue is poured into the long slot of the substrate via the channel formed by the long slot of the substrate, for covering the plurality of wires.

8 Claims, 2 Drawing Sheets

SEMICONDUCTOR PACKAGE STRUCTURE HAVING CENTRAL LEADS AND METHOD FOR PACKAGING THE SAME

BACKGROUND OF THE INVENTION

1. Field of the Invention

The invention relates to a semiconductor package structure having central leads and a method for packaging the same, and in particular to a semiconductor device that is packaged by glue pouring so as to improve the package efficiency of the semiconductor.

2. Description of the Related Art

FIGS. 1A and 1B show a conventional semiconductor package structure having central leads in transverse and longitudinal section views, respectively. The semiconductor package structure includes a substrate 10, a semiconductor device 12, and glue 14 and 16. The substrate 10 is formed with a long slot 18. A plurality of bonding pads 20 formed on the semiconductor device 12 are located in the long slot 18 of the substrate. The bonding pads 20 are electrically connected to the substrate 10 by a plurality of wires 22. The glue 14 and 16 cover the semiconductor device 12 and the long slot 18 of the substrate 10, respectively, for protecting the semiconductor device 12 and the plurality of wires 22.

The method for gluing the glue 14 and 16 in the semiconductor package structure having central leads is performed by glue dispensing or screen printing in order to pour the glue 14 and 16 to cover the semiconductor device 12 and the long slot 18 of the substrate 10. Therefore, there should be two processes for completing the gluing. Thus, the processes for the semiconductor package having central leads are complicated and the cost of the package is relatively high.

In view of the above-mentioned problems, it is therefore an object of the present inventor to provide a semiconductor package structure having central leads and a method for packaging the same. In the structure and method of the invention, the glue is poured to cover the semiconductor device and the long slot of the substrate by only one process of glue pouring to complete the package of the semiconductor device. Thus, the manufacturing processes are simple and convenient.

SUMMARY OF THE INVENTION

It is therefore a primary object of the invention to provide a semiconductor package structure having central leads and a method for packaging the same. The structure and method are done by glue pouring so as to finish the package of the semiconductor device. Thus, the manufacturing processes are simple and convenient.

It is another object of the invention to provide a semiconductor package structure having central leads, in which a semiconductor device can be efficiently mounted on the substrate when the semiconductor device is packaged by glue pouring.

To achieve the above-mentioned objects, the invention is characterized in that the semiconductor package structure includes:

a substrate having an upper surface, a lower surface, and a long slot penetrating from the upper surface to the lower surface, the lower surface being formed with a plurality of signal output terminals;

a semiconductor device on which are formed with a plurality of bonding pads, the semiconductor device being mounted on the upper surface of the substrate, the plurality of bonding pads on the semiconductor device being exposed via the long slot of the substrate, and the length of the semiconductor device being smaller than that of the long slot of the substrate so that a channel is formed at one side of the long slot when the semiconductor device is mounted on the substrate;

a plurality of wires within the long slot of the substrate for electrically connecting the plurality of bonding pads on the semiconductor device to the plurality of signal output terminals on the substrate; and glue for sealing the upper surface of the substrate to protect the semiconductor device, the glue being poured into the lower surface of the substrate via the channel formed by the long slot of the substrate, for covering the plurality of wires.

The invention is also characterized in that the method for packaging the semiconductor package structure includes:

providing a substrate, the substrate having an upper surface, a lower surface, and a long slot penetrating from the upper surface to the lower surface, the lower surface being formed with a plurality of signal output terminals;

providing a semiconductor device on which are formed with a plurality of bonding pads, the semiconductor device being mounted on the upper surface of the substrate, the plurality of bonding pads on the semiconductor device being exposed via the long slot of the substrate, and the length of the semiconductor device being smaller than that of the long slot of the substrate so that a channel is formed at one side of the long slot when the semiconductor device is mounted on the substrate;

providing a plurality of wires within the long slot of the substrate for electrically connecting the plurality of bonding pads on the semiconductor device to the plurality of signal output terminals on the substrate; and providing glue for sealing the upper surface of the substrate to protect the semiconductor device, the glue being poured into the lower surface of the substrate via the channel formed by the long slot on the upper surface of the substrate, for covering the plurality of wires.

Thus, the package of the semiconductor device can be completed by only one process for pouring the glue, thereby facilitating the manufacturing process and lowering the manufacturing cost.

BRIEF DESCRIPTION OF THE DRAWINGS

These and other objects and advantages of the present invention will become apparent by reference to the following description and accompanying drawings wherein.

DETAILED DESCRIPTION OF THE INVENTION

Figure 1A:
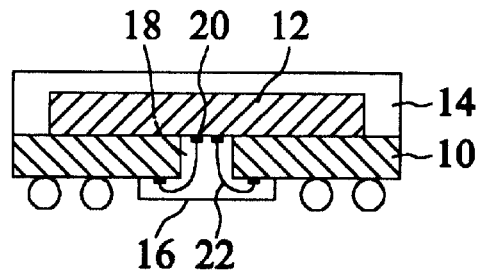
FIGS. 1A and 1B are transverse and longitudinal section views showing a conventional semiconductor package structure having central leads, respectively.
Figure 1B:
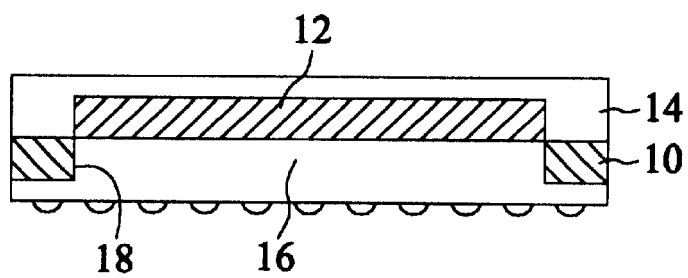
Figure 2:
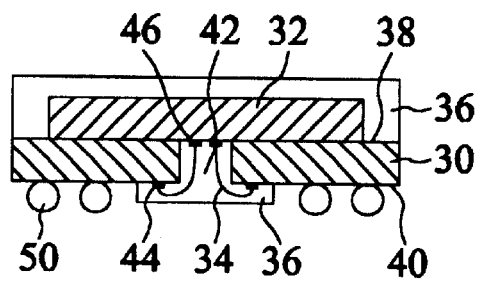
FIG. 2 is a transverse section view showing a semicondutor package structure having central leads of the invention.
Figure 3:
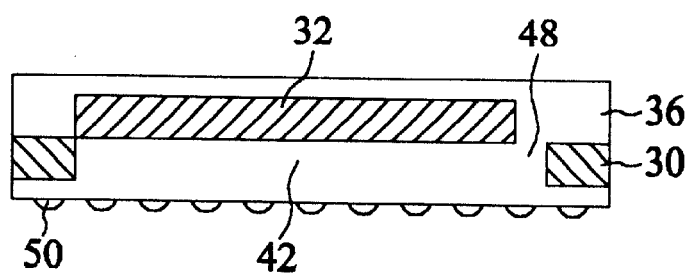
FIG. 3 is a longitudinal section view showing the semicondutor package structure having central leads of the invention.

Referring to FIGS. 2 and 3, a semiconductor package structure having central leads of the invention includes a substrate 30, a semiconductor device 32, a plurality of wires 34, and glue 36.

The substrate 30 includes an upper surface 38, a lower surface 40, and a long slot 42 penetrating from the upper surface 38 to the lower surface 40. The lower surface 40 is formed with a plurality of signal output terminals 44 that are electrically connected to BGA metallic balls 50.

A plurality of bonding pads 46 are formed on the semiconductor device 32 that is mounted on the upper surface 38 of the substrate 30. The plurality of bonding pads 46 on the semiconductor device 32 are exposed via the long slot 42 of the substrate 30. The length of the semiconductor device 32 is slightly smaller than that of the long slot 42 of the substrate 30. Thus, when the semiconductor device 32 is mounted on the substrate 30, a channel 48 is formed at one side of the long slot 42.

The plurality of wires 34 are arranged within the long slot 42 of the substrate 30. One end of each wire 34 is electrically connected to a corresponding bonding pad 46 on the semiconductor device 32, while the other end of the wire 34 is electrically connected to a corresponding signal output terminal 44 on the substrate 30. Thus, the semiconductor device 32 is electrically connected to the substrate 30.

Figure 4:
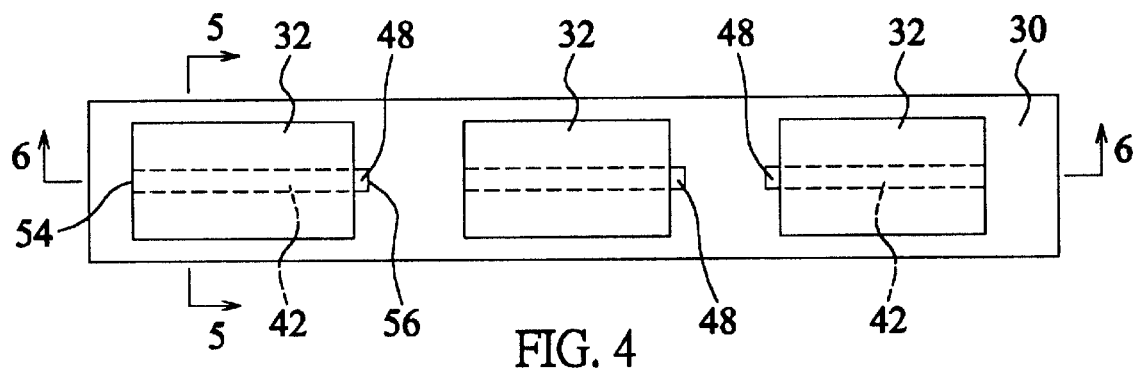
FIG. 4 is a schematic illustration showing the situation of glue pouring of the invention.
Figure 5:
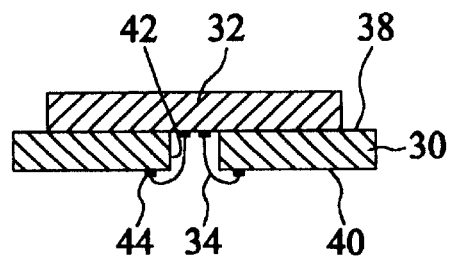
FIG. 5 is a cross-sectional view along a line 5—5 of FIG. 4.
Figure 6:
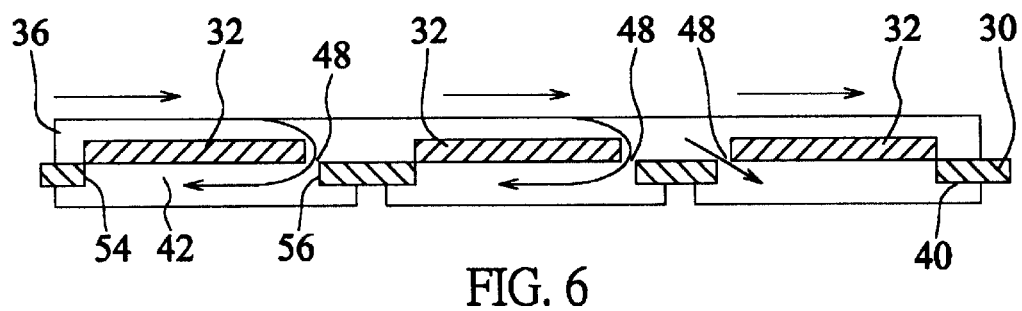
FIG. 6 is a cross-sectional view along a line 6—6 of FIG. 4.

As shown in FIGS. 4, 5 and 6, three semiconductor devices 32 are provided on the substrate 30 formed with three long slots 42 in advance. By doing so, the upper surface 38 of the substrate 30 is formed with three channels 48 penetrating from the upper surface 38 to the lower surface 40 of the substrate 30. Each long slot 42 has a first side 54 and a second side 56. The first and second channels 48 are formed at the second sides 56, while the last channel 48 is formed at the first side 54. Then, a plurality of wires 34 are put into each long slot 42 so as to form electrical connections between the bonding pads 46 of the semiconductor device 32 and the signal output terminals 44 of the substrate 30.

Referring to FIG. 6, the glue 36 is poured into the upper surface 38 of the substrate 30 from the first side 54 of the long slot 42 (indicated by the direction of the arrow). At this time, the glue 36 covers the semiconductor device 32 along the direction indicated by the arrow. After the glue 36 flows through the channel 48 of the second side 56 of the long slot 42, it flows to the lower surface 40 of the substrate 30 along the channel 48. In this case, the long slot 42 of the substrate 30 is sealed for protecting the plurality of wires 34 within the long slot 42.

In addition, the glue 36 flows through the middle and the last semiconductor devices 32, and flows to the lower surfaces 40 of the substrates 30 through the channels 48. After the glue pouring is completed, a plurality of BGA metallic balls 50 are formed on the lower surfaces of the substrates and are electrically connected to the plurality of signal output terminals 44. Thus, a number of packages of the semiconductor devices 32 can be completed simultaneously. Finally, the packages of the semiconductor devices are cut into a plurality of individual semiconductor devices. Thus, the manufacturing processes are simple and convenient.

Moreover, the channels 48 in front of and in the middle of the substrate 30 are located behind the semiconductor devices 32. Thus, when the glue 36 is poured, the semiconductor devices 32 can be pressed by the glue. In this case, the situation that the glue 36 upheaves the semiconductor devices 32 away from the substrate 30 and the situation of generating overflowed glue can be avoided. On the other hand, the channel 48 behind the substrate 30 may be located in front of the semiconductor device 32. Since the moulding pressure of the glue 36 flowing behind the substrate 30 is weakened, the backward semiconductor device 32 is free from being upheaved from the substrate 30.

According to the above-mentioned structure, the semiconductor package structure having central leads and method for packaging the same in accordance with the invention have the following advantages.

1. Since the semiconductor devices 32 are packaged by glue pouring, the manufacturing processes can be simplified, and the package efficiency can also be improved.
2. Since the semiconductor devices 32 are packaged by glue pouring, a plurality of semiconductor devices 32 can be packaged simultaneously, and the package efficiency can also be improved.

While the invention has been described by way of example and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A semiconductor package structure having central leads, comprising:
    a substrate having an upper surface, a lower surface, and a long slot penetrating from the upper surface to the lower surface, the lower surface being formed with a plurality of signal output terminals;
    a semiconductor device on which are formed of a plurality of bonding pads, the semiconductor device being mounted on the upper surface of the substrate, the plurality of bonding pads on the semiconductor device being exposed via the long slot of the substrate, and the length of the semiconductor device being smaller than that of the long slot of the substrate so that a channel is formed at one side of the long slot when the semiconductor device is mounted on the substrate;
    a plurality of wires within the long slot of the substrate for electrically connecting the plurality of bonding pads on the semiconductor device to the plurality of signal output terminals on the substrate; and
    glue for sealing the upper surface of the substrate and the semiconductor device to protect the semiconductor device, the glue being poured into the lower surface of the substrate via the channel formed by the long slot of the substrate, for covering the plurality of wires.

2. The semiconductor package structure having central leads according to claim 1, wherein the long slot includes a first side and a second side, the channel is formed at the second side, the glue flows over the upper surface of the substrate and the semiconductor device, and then flows to the lower surface of the substrate via the channel.

3. The semiconductor package structure having central leads according to claim 1, wherein metallic balls are formed at the plurality of signal output terminals on the lower surface of the substrate.

4. The semiconductor package structure having central leads according to claim 3, wherein the metallic balls are BGA (ball grid array) metallic balls.

5. A method for packaging a semiconductor package having central leads, comprising the steps of:

providing a substrate, the substrate having an upper surface, a lower surface, and a long slot penetrating from the upper surface to the lower surface, the lower surface being formed with a plurality of signal output terminals;

providing a semiconductor device on which are formed of a plurality of bonding pads, the semiconductor device being mounted on the upper surface of the substrate, the plurality of bonding pads on the semiconductor device being exposed via the long slot of the substrate, and the length of the semiconductor device being smaller than that of the long slot of the substrate so that a channel is formed at one side of the long slot when the semiconductor device is mounted on the substrate;

providing a plurality of wires within the long slot of the substrate for electrically connecting the plurality of bonding pads on the semiconductor device to the plurality of signal output terminals on the substrate; and providing glue for sealing the upper surface of the substrate and the semiconductor device to protect the semiconductor device, the glue being poured into the lower surface of the substrate via the channel formed by the long slot of the substrate, for covering the plurality of wires.

6. The method for packaging a semiconductor package having central leads according to claim 5, wherein the long slot includes a first side and a second side, the channel is formed at the second side, the glue flows over the upper surface of the substrate and the semiconductor device, and then flows to the lower surface of the substrate via the channel.

7. The method for packaging a semiconductor package having central leads according to claim 5, further comprising:

forming a plurality of metallic balls at the plurality of signal output terminals on the lower surface of the substrate after the glue is poured.

8. The method for packaging a semiconductor package having central leads according to claim 7, wherein the metallic balls are BGA (ball grid array) metallic balls.

* * * * *